United States Patent
Kuo et al.

(10) Patent No.: US 9,166,105 B2
(45) Date of Patent: Oct. 20, 2015

(54) LIGHT EMITTING DEVICE

(71) Applicant: Epistar Corporation, Hsinchu (TW)

(72) Inventors: De-Shan Kuo, Hsinchu (TW); Ting-Chia Ko, Hsinchu (TW); Chung-Hsiang Tu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/729,842

(22) Filed: Dec. 28, 2012

(65) Prior Publication Data

US 2014/0048830 A1 Feb. 20, 2014

Related U.S. Application Data

(63) Continuation of application No. 13/089,485, filed on Apr. 19, 2011, now Pat. No. 8,343,788.

(51) Int. Cl.
| | | |
|---|---|---|
| *H01L 33/22* | (2010.01) | |
| *H01L 31/0236* | (2006.01) | |
| *H01L 33/00* | (2010.01) | |

(52) U.S. Cl.
CPC .......... *H01L 33/22* (2013.01); *H01L 31/02363* (2013.01); *H01L 33/0095* (2013.01)

(58) Field of Classification Search
CPC .................................................. H01L 21/02109
See application file for complete search history.

(56) References Cited

U.S. PATENT DOCUMENTS

| | | | |
|---|---|---|---|
| 2005/0093008 A1* | 5/2005 | Suehiro et al. | 257/98 |
| 2006/0054907 A1 | 3/2006 | Lai | |
| 2011/0073894 A1 | 3/2011 | Chu et al. | |
| 2011/0241045 A1 | 10/2011 | Ye et al. | |

* cited by examiner

*Primary Examiner* — Cheung Lee
(74) *Attorney, Agent, or Firm* — Patterson & Sheridan, LLP

(57) ABSTRACT

A light-emitting device includes: a substrate; a first semiconductor layer disposed on the substrate and having a first surface; a rough structure formed in the first semiconductor layer, the rough structure comprising porous structures formed therein and a portion of the porous structures having openings exposed on the first surface of the first semiconductor layer; and an active layer formed on the first semiconductor layer.

12 Claims, 12 Drawing Sheets

Laser

LIGHT EMITTING DEVICE

RELATED APPLICATION

This application is a continuation of U.S. patent application, Ser. No. 13/089,485, entitled "LIGHT EMITTING DEVICE AND MANUFACTURING METHOD THEREOF", filed Apr. 19, 2011, now pending, the entire content of which is incorporated herein by reference.

BACKGROUND

1. Technical Field

The present disclosure relates to a light emitting device and manufacturing method thereof.

2. Description of the Related Art

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power consumption, therefore it is considered as a new light source for the illumination markets. The LED applies to various applications like the traffic signal, backlight module, street light, and medical instruments, and is gradually replacing the traditional lighting sources.

Generally, the light extraction efficiency depends on the internal quantum efficiency and light extraction efficiency. The internal quantum efficiency can be defined as opto-electrical conversion efficiency in the LED.

The light extraction efficiency refers to the efficiency of the light produced in the light emitting layer extracted from the LED chip. In the meantime, light extraction efficiency is known to depend on the ratio of refraction indexes inside and outside the LED on the light extraction surface, and the surface properties thereof. Normally, the refraction index of the compound semiconductor commonly used as the material of LED is much greater than that of air.

SUMMARY OF THE DISCLOSURE

A method of fabricating a light emitting device includes: providing a substrate; forming an epitaxial stack on the substrate wherein the epitaxial stack comprising a first conductivity semiconductor layer, an active layer and a second conductivity semiconductor layer; forming a mesa on the epitaxial stack to expose partial of the first conductivity semiconductor layer; and etching the surface of the first conductivity semiconductor layer and forming a least one rough structure on the surface of the first conductivity semiconductor layer wherein the first conductivity semiconductor layer is sandwiched by the substrate and the active layer.

A light emitting device includes: a substrate; an epitaxial stack on the substrate wherein the epitaxial stack comprising a first conductivity semiconductor layer, an active layer and a second conductivity semiconductor layer; and a mesa on the epitaxial stack exposing partial of the first conductivity semiconductor layer wherein the surface of the first conductivity semiconductor layer comprising a least one rough structure wherein the first conductivity semiconductor layer is sandwiched by the substrate and the active layer.

A light-emitting device includes: a substrate; a first semiconductor layer disposed on the substrate and having a first surface; a rough structure formed in the first semiconductor layer, the rough structure comprising porous structures formed therein and a portion of the porous structures having openings exposed on the first surface of the first semiconductor layer; and an active layer formed on the first semiconductor layer.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1A:
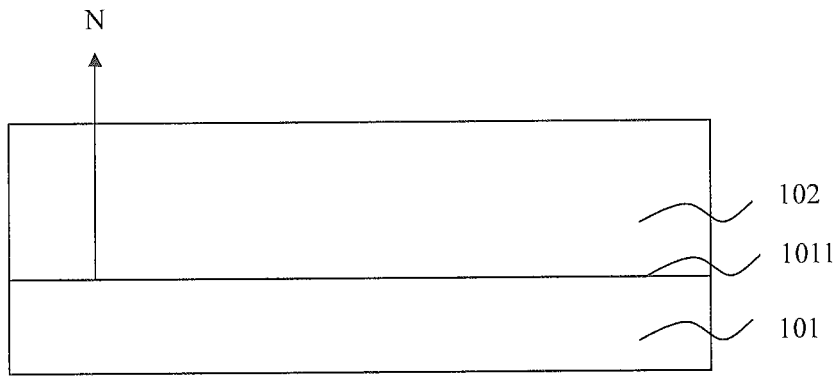
FIGS. 1A to 1H illustrate a process flow of a method of fabricating a light emitting device of the first embodiment in the present disclosure.

Reference is made in detail to the preferred embodiments of the present application, examples of which are illustrated in the accompanying drawings. Wherever possible, the same reference numbers are used in the drawings and the description to refer to the same or like parts.

The present disclosure describes a light emitting device and a method of fabricating the light emitting device. In order to have a thorough understanding of the present disclosure, please refer to the following description and the illustrations of FIG. 1A to FIG. 4C.

Figure 1B:
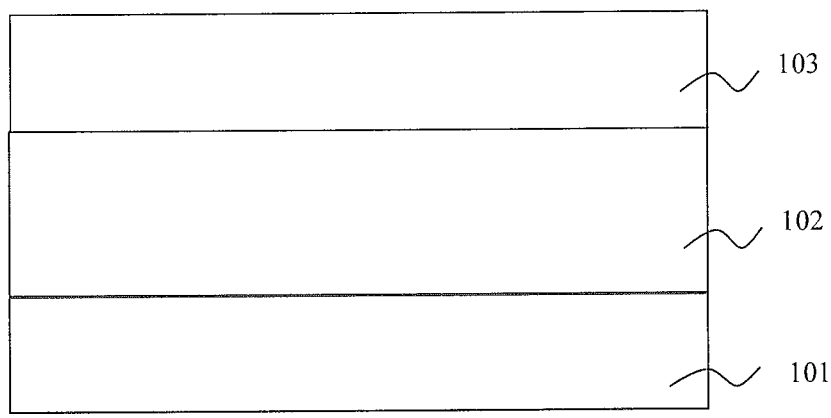
Figure 1C:
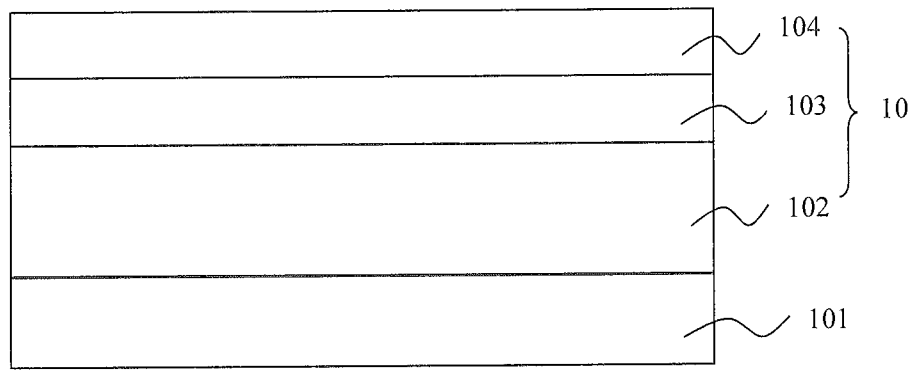

FIGS. 1A to 1H illustrate a process flow of the method of fabricating the light emitting device of first embodiment of the present disclosure. FIG. 1A shows a substrate 101 including a first major surface 1011 and a first conductivity semiconductor layer 102 formed on the first major surface 1011. FIG. 1B shows an active layer 103 formed on the first conductivity semiconductor layer 102. FIG. 1C shows a second conductivity semiconductor layer 104 formed on the active layer 103 to form an epitaxial stack 10 including the first conductivity semiconductor layer 102, the active layer 103 and the second conductivity semiconductor layer 104.

The material of the substrate(s) 101 used for growing or supporting the epitaxial stack 10 can include but does not limit to germanium (Ge), gallium arsenide (GaAs), indium phosphide (InP), sapphire, silicon carbide (SiC), silicon (Si), lithium aluminium oxide (LiAlO$_2$), zinc oxide (ZnO), gallium nitride (GaN), aluminum nitride (AlN), glass, composite, diamond, CVD diamond, diamond-like carbon (DLC) and any combination thereof.

The material of the epitaxial stack 10 including the first conductivity semiconductor layer 102, the active layer 103 and the second conductivity semiconductor layer 104 contains at least one element selected from the group consisting of Al, Ga, In, As, P, and N, such as GaN, AlGaInP or any other suitable materials.

In accordance with one embodiment of the present disclosure, each of the first conductivity semiconductor layer 102 and the second conductivity semiconductor layer 104 can be a single layer or multiple layers ("multiple layers" means two or more layers), have distinct polarities or distinct dopants. For example, the first conductivity layer 102 is an n-type semiconductor layer; the second conductivity layer 104 is a p-type semiconductor layer. The active layer 103 disposed between the first conductivity layer 102 and the second conductivity layer 104 is a region where the light energy and the electrical energy could be transferred or induced to transfer. The one that the electrical energy can be transferred to the light energy is such as a light emitting diode, a liquid crystal display, and an organic light emitting diode. The one that the light energy can be transferred to the electrical energy is such as a solar cell, and an optoelectronic diode.

The transferred light emission spectrum of the light emitting diode can be controlled by changing the physical or chemical arrangement of one layer or more layers in the light emitting diode. The light emitting diode can be composed of several materials, such as the series of aluminum gallium indium phosphide (AlGaInP), the series of aluminum gallium indium nitride (AlGaInN), and/or the series of zinc oxide (ZnO). The active layer can be configured to be a single heterostructure (SH), a double heterostructure (DH), a double-side double heterostructure (DDH), or a multi-quantum well (MWQ). Besides, the wavelength of the emitting light could be controlled by changing the number of the pairs of the quantum well.

Figure 1D:
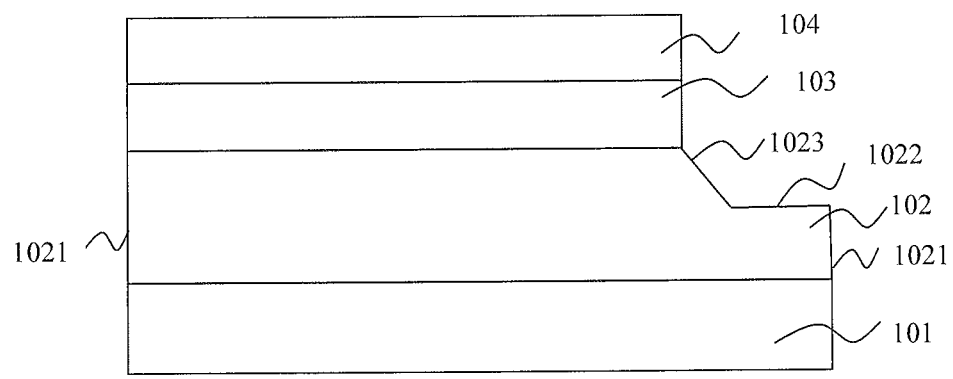

FIG. 1D illustrates a further step by employing photolithography and etching process to etch the epitaxial stack 10 including the first conductivity semiconductor layer 102, the active layer 103 and the second conductivity semiconductor layer 104 to form a mesa structure wherein a portion of the surface of the first conductivity semiconductor layer 102 is exposed and included a first surface 1021 which is vertical to the surface of the substrate, a second surface 1022 which is parallel to the surface of the substrate and a third surface 1023 which is connecting the second surface 1022 to the active layer 103.

Figure 1E:
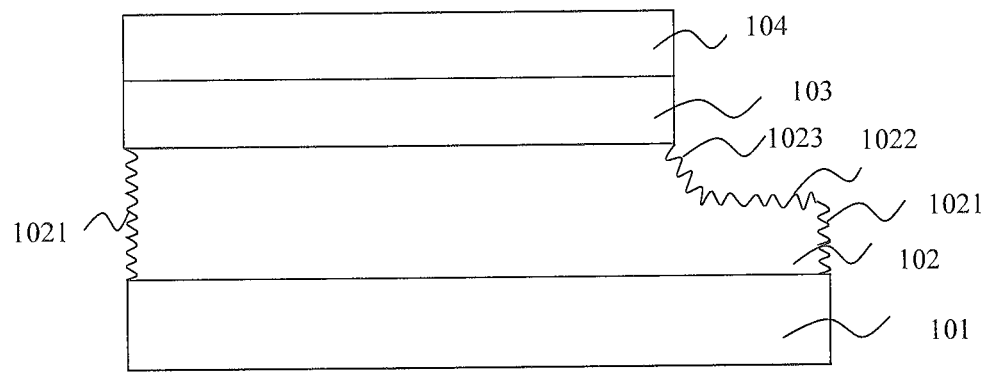

Following, as shown in FIG. 1E, the first surface 1021, second surface 1022, and the third surface 1023 of the first conductivity semiconductor layer 102 can be etched by the following method to form a least one rough structure such as pore, void, bore, pinhole, cavity or porous structure.

The methods include: 1) Wet etching with an aqueous solution of a least one of $H_2SO_4$, $H_3PO_4$, $H_2C_2O_4$, HCl, KOH, and NaOH, ethylene glycol solution or their mixture;

2) Electrochemical etching with an aqueous solution of a least one of $H_2SO_4$, $H_3PO_4$, $H_2C_2O_4$, HCl, KOH, and NaOH, an ethylene glycol solution or their mixture; or 3) Dry etching such as inductive coupling plasma (ICP), reactive ion etch (RIE) by a gas containing at least one of HCl, $Cl_2$, $SF_6$, $BCl_3$ and $CH_4$.

The rough structure can be formed on the first surface 1021, the second surface 1022 and the third surface 1023 of the first conductivity semiconductor layer 102 by any of these methods. However, the shape, density, distances and/or depth thereof is adjustable with the conditions for formation.

The shape of the rough structure is adjustable by the etching conditions, and can form various types such as circle, hexagon, dodecagon, conical, or pyramidal shapes.

The depth of the rough structure can be 10 nm-5000 nm, 500 nm-5000 nm, 1000 nm-5000 nm, 2000 nm-5000 nm, 3000 nm-5000 nm, or 4000 nm-5000 nm. The distance between each of the rough structure can be 10 nm-10000 nm, 100 nm-10000 nm, 500 nm-10000 nm, 1000 nm-10000 nm, 2000 nm-10000 nm, 4000 nm-10000 nm, 6000 nm-10000 nm, 8000 nm-10000 nm. The percentage of the area occupied by the rough structures on the surface of the first conductivity semiconductor layer 102 is 5%-90%, 10%-90%, 20%-90%, 30%-90%, 40%-90%, 50%-90%, 60%-90%, 70%-90%, or 80%-90%

In one embodiment of this disclosure, the surface of the first conductivity semiconductor layer 102 is etched by electrochemical etching with the voltage of 5V-10V, 5V-20V, 5-30V or 5V-40V. The etch time is 1 min-10 min, 1 min-20 min, 1 min-30 min, 1 min-40 min, 1 min-50 min or 1 min-1 hr. In one embodiment, the electrochemical etching is performed with an aqueous solution of $H_2C_2O_4$.

Figure 1F:
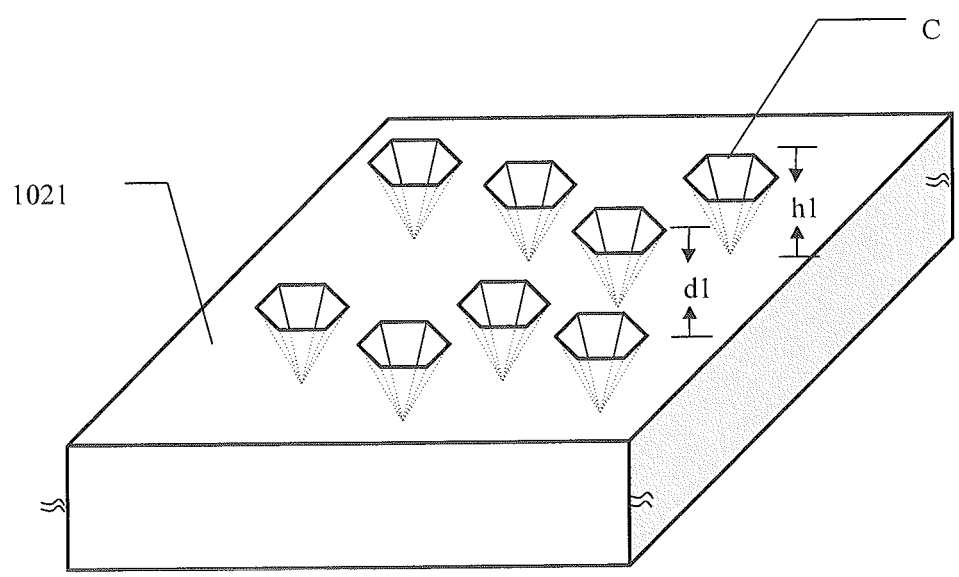

FIG. 1F illustrates an enlarged view of the first surface 1021 of the first conductivity semiconductor layer 102. In this embodiment, the rough structure can be a plurality of cavities C on the first surface 1021 having an average depth h1. The average depth h1 can be 10 nm-5000 nm, 500 nm-5000 nm, 1000 nm-5000 nm, 2000 nm-5000 nm, 3000 nm~5000 nm, 4000 nm-5000 nm. The distance d1 between each of the cavities can be 10 nm-10000 nm, 100 nm-10000 nm, 500 nm-10000 nm, 1000 nm-10000 nm, 2000 nm-10000 nm, 4000 nm-10000 nm, 6000 nm-10000 nm, 8000 nm-10000 nm. The percentage of the area occupied by the plurality of cavities on the surface of the first conductivity semiconductor layer is 5%-90%, 10%-90%, 20%-90%, 30%-90%, 40%-90%, 50%-90%, 60%-90%, 70%-90%, 80%-90%.

In one embodiment of this disclosure, the etching process can be performed twice with any of these methods to form a double rough structure on a least one of the first surface 1021, the second surface 1022 and the third surface 1023 of the first conductivity semiconductor layer 102. In one embodiment, the dry etching can be performed first, and the electrochemical etching is performed next to form a double rough structure on a least one of the first surface 1021, the second surface 1022 and the third surface 1023 of the first conductivity semiconductor layer 102.

Figure 1G:
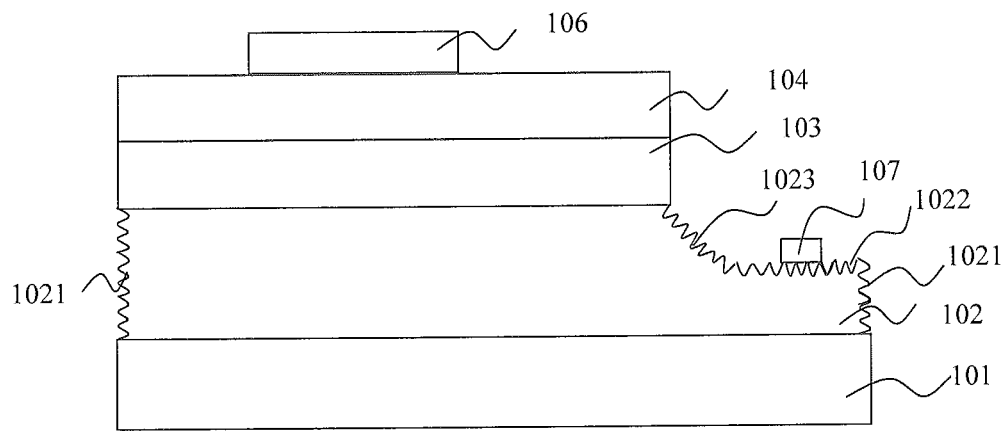
Figure 1H:
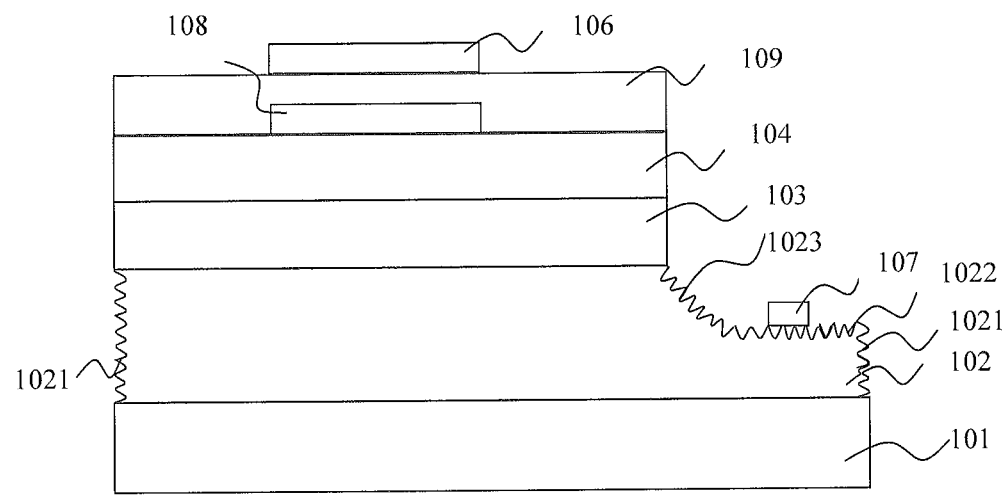

Following, FIG. 1G illustrates a first electrode 106 formed on the second conductivity semiconductor layer 104 and a second electrode 107 on the first conductivity semiconductor layer 102. The material of the first electrode 106 and the second electrode 107 can be Cr, Ti, Ni, Pt, Cu, Au, Al or Ag.

In addition, as shown in 1H, a transparent conductive oxide layer 108 can be formed on the second conductivity semiconductor layer 104, and the first electrode 106 can be formed on the transparent conductive oxide layer 108. The material of the transparent conductive oxide layer 108 comprises one or more materials selected from a group consisting of ITO, InO, SnO, CTO, ATO, AZO and ZnO.

Figure 2A:
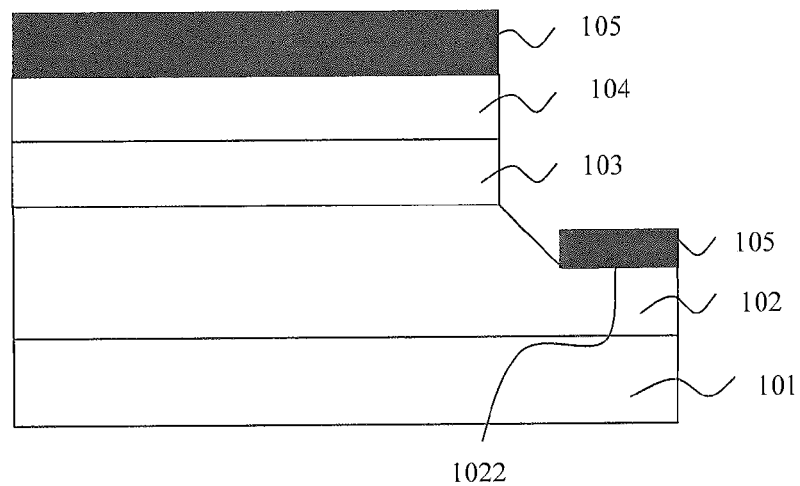
FIGS. 2A to 2B illustrate a process flow of another method of fabricating a light emitting device of the second embodiment in the present disclosure.
Figure 2B:
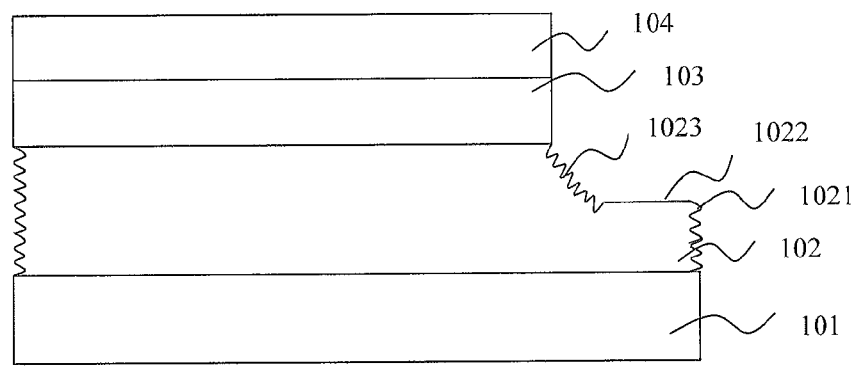

FIGS. 2A to 2B illustrate second embodiment of the present disclosure. In the embodiment, an etching protection layer 105 is formed before performing the etching process. FIG. 2A shows forming an etching protection layer 105 on the top of the second conductivity semiconductor layer 104 and the second surface 1022 of the first conductivity semiconductor layer 102. The material of the etching protection layer 105 can be $SiO_2$ or $SiN_x$.

After forming the etching protection layer 105, an etching process is performed to form at least one rough structure on the first surface 1021, and the third surface 1023 of the first conductivity semiconductor layer 102. As shows in FIG. 2B, the first surface 1021, and the third surface 1023 of the first conductivity semiconductor layer 102 can be etched by the following method to form a least one rough structure such as pore, void, bore, pinhole, cavity or porous structure.

The methods include: 1) Wet etching with an aqueous solution of a least one of $H_2SO_4$, $H_3PO_4$, $H_2C_2O_4$, HCl, KOH, and NaOH, ethylene glycol solution or their mixture;

2) Electrochemical etching with an aqueous solution of a least one of $H_2SO_4$, $H_3PO_4$, $H_2C_2O_4$, HCl, KOH, and NaOH, an ethylene glycol solution or their mixture; or 3) Dry etching such as inductive coupling plasma (ICP), reactive ion etch (RIE) by a gas containing at least one of HCl, $Cl_2$, $SF_6$, $BCl_3$ and $CH_4$.

The rough structure can be formed on the first surface 1021 and the third surface 1023 of the first conductivity semiconductor layer 102 by any of these methods. However, the shape, density, distance and/or depth thereof is adjustable with the conditions for formation.

The shape of the rough structures is adjustable by the etching conditions, and can form various types such as circle, hexagon, dodecagon, conical, or pyramidal shapes.

The depth of the rough structure can be 10 nm-5000 nm, 500 nm-5000 nm, 1000 nm-5000 nm, 2000 nm-5000 nm, 3000 nm-5000 nm, or 4000 nm-5000 nm. The distance between each rough structure can be 10 nm-10000 nm, 100 nm-10000 nm, 500 nm-10000 nm, 1000 nm-10000 nm, 2000 nm-10000 nm, 4000 nm-10000 nm, 6000 nm-10000 nm, or 8000 nm-10000 nm. The percentage of the area occupied by the rough structures on the surface of the first conductivity semiconductor layer 102 is 5%-90%, 10%-90%, 20%-90%, 30%-90%, 40%-90%, 50%-90%, 60%-90%, 70%-90%, or 80%-90%

In one embodiment of this disclosure, the surface of the first conductivity semiconductor layer 102 is etched by electrochemical etching with the voltage of 5V-10V, 5V-20V, 5-30V or 5V-40V. The etch time is 1 min-10 min, 1 min-20 min, 1 min-30 min, 1 min-40 min, 1 min-50 min or 1 min-1 hr. In one embodiment, the electrochemical etching is performed with an aqueous solution of $H_2C_2O_4$.

In one embodiment of this disclosure, the etching process can be performed twice with any of these methods on a least one of the first surface 1021 and the third surface 1023 of the first conductivity semiconductor layer 102. In one embodiment, the dry etching can be performed first, and the electrochemical etching is performed next on a least one of the first surface 1021 and the third surface 1023 of the first conductivity semiconductor layer 102.

Figure 3A:
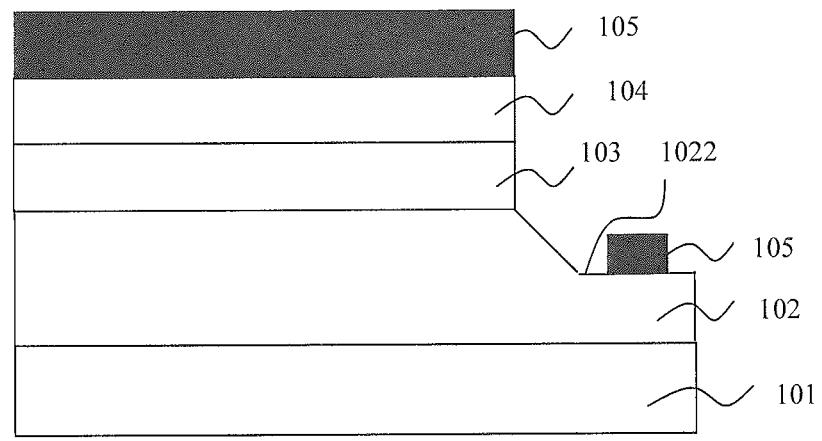
FIGS. 3A to 3D illustrate a process flow of another method of fabricating a light emitting device of the third embodiment in the present disclosure.
Figure 3B:
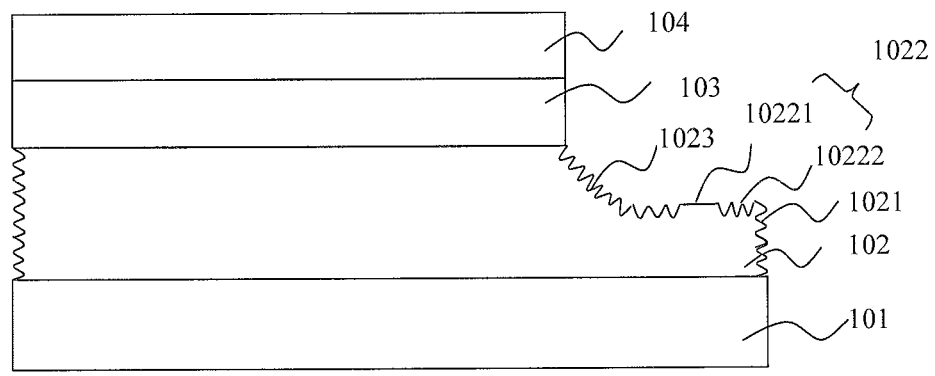

FIGS. 3A to 3B illustrate third embodiment of the present disclosure. In the embodiment, the etching protection layer 105 is formed before performing the etching process. FIG. 3A shows forming an etching protection layer 105 on the top of the second conductivity semiconductor layer 104 and partial of the second surface 1022 of the first conductivity semiconductor layer 102. The material of the etching protection layer 105 can be $SiO_2$ or $SiN_x$.

After forming the etching protection layer 105, an etching process is performed to forming at least one rough structure on first surface 1021, partial of the second surface 1022 and the third surface 1023 of the first conductivity semiconductor layer 102. As shows in FIG. 3B, in one embodiment of the disclosure, the first surface 1021, partial of the second surface 1022 and the third surface 1023 of the first conductivity semiconductor layer 102 can be etched by the following method to form a least one rough structure such as pore, void, bore, pinhole, cavity or porous structure. In this embodiment, the second surface 1022 can comprise a substantially smooth section 10221 and a rough section 10222 surrounding the substantially smooth section 10221.

The methods include: 1) Wet etching with an aqueous solution of a least one of $H_2SO_4$, $H_3PO_4$, $H_2C_2O_4$, HCl, KOH, and NaOH, ethylene glycol solution or their mixture;

2) Electrochemical etching with an aqueous solution of a least one of $H_2SO_4$, $H_3PO_4$, $H_2C_2O_4$, HCl, KOH, and NaOH, an ethylene glycol solution or their mixture; or 3) Dry etching such as inductive coupling plasma (ICP), reactive ion etch (RIE) by a gas containing at least one of HCl, $Cl_2$, $SF_6$, $BCl_3$ and $CH_4$.

The rough structure can be formed on the first surface 1021, partial of the second surface 1022 and the third surface 1023 of the first conductivity semiconductor layer 102 by any of these methods. However, the shape, density, distance and/or depth thereof is adjustable with the conditions for formation.

The shape of the rough structures is adjustable by the etching conditions, and can form various types such as circle, hexagon, dodecagon, conical, or pyramidal shapes.

The depth of the rough structures can be 10 nm-5000 nm, 500 nm-5000 nm, 1000 nm-5000 nm, 2000 nm-5000 nm, 3000 nm-5000 nm, or 4000 nm-5000 nm. The distance between each rough structure can be 10 nm-10000 nm, 100 nm-10000 nm, 500 nm-10000 nm, 1000 nm-10000 nm, 2000 nm-10000 nm, 4000 nm-10000 nm, 6000 nm-10000 nm, or 8000 nm-10000 nm. The percentage of the area occupied by the rough structures on the surface of the first conductivity semiconductor layer 102 is 5%-90%, 10%-90%, 20%-90%, 30%-90%, 40%-90%, 50%-90%, 60%-90%, 70%-90%, or 80%-90%.

In one embodiment of this disclosure, the etching process can be performed twice with any of these methods and formed a double rough structure on a least one of the first surface 1021, the partial of the second surface 1022 and the third surface 1023 of the first conductivity semiconductor layer 102. In one embodiment, the dry etching can be performed first, and the electrochemical etching is performed next to form a double rough structure on the first surface 1021, the partial of the second surface 1022 and the third surface 1023 of the first conductivity semiconductor layer 102.

Figure 3C:
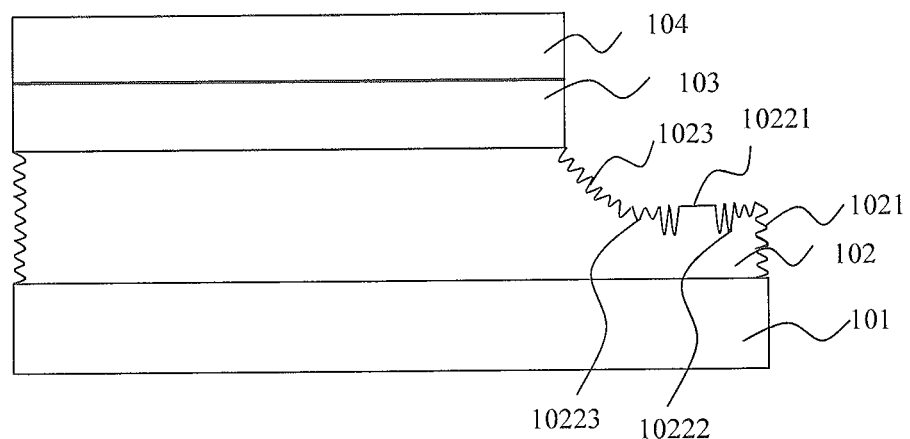
Figure 3D:
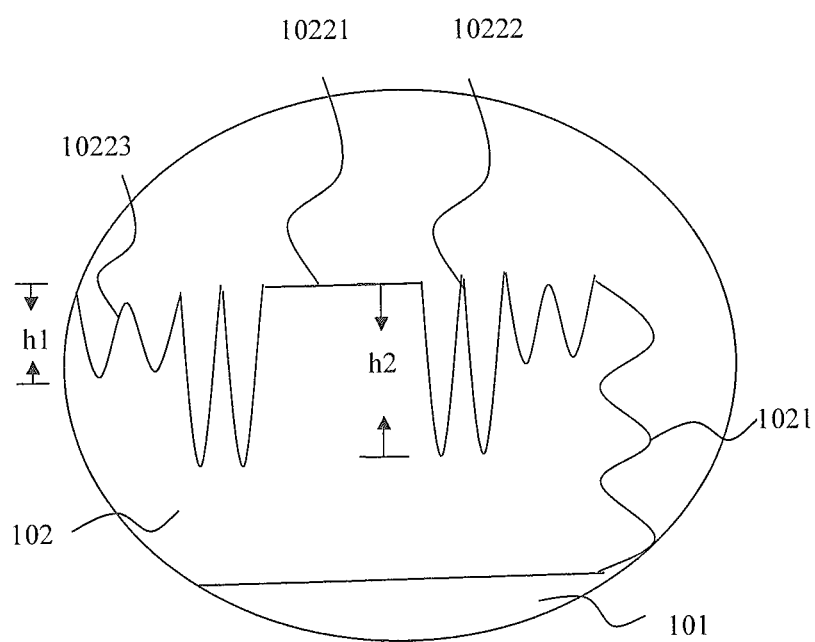

In another embodiment of the disclosure, as shown in FIGS. 3C and 3D, depending on the etching conditions, the second surface 1022 can comprise three different types including a substantially smooth section 10221, a first level rough section 10223 and a second level rough section 10222. The second level rough structure 10222 is adjacent to the substantially smooth section 10221 and has a depth h2, and the first level rough structure 10223 is adjacent to the second level rough structure 10222 and has a depth h1 different from h2. The h1 and h2 can be 10 nm-5000 nm, 500 nm-5000 nm, 1000 nm-5000 nm, 2000 nm-5000 nm, 3000 nm-5000 nm, or 4000 nm-5000 nm.

The distance between each of the rough structures can be 10 nm-10000 nm, 100 nm-10000 nm, 500 nm-10000 nm, 1000 nm-10000 nm, 2000 nm-10000 nm, 4000 nm-10000 nm, 6000 nm-10000 nm, or 8000 nm-10000 nm. The percentage of the area occupied by the rough structures on the surface of the first conductivity semiconductor layer 102 is 5%-90%, 10%-90%, 20%-90%, 30%-90%, 40%-90%, 50%-90%, 60%-90%, 70%-90%, or 80%-90%.

Further, the shape of the rough structures depends on the etching conditions, and is available in many types such as circle, hexagon, dodecagon, conical, or pyramidal shapes.

In one embodiment of this disclosure, the etching process can be performed twice with any of these methods on a least one of these methods and formed a double rough structure on the first surface 1021, the partial of the second surface 1022 and the third surface 1023 of the first conductivity semiconductor layer 102. In one embodiment, the dry etching can be performed first, and the electrochemical etching is performed next to form a double rough structure on the first surface 1021, the partial of the second surface 1022 and the third surface 1023 of the first conductivity semiconductor layer 102.

Figure 4A:
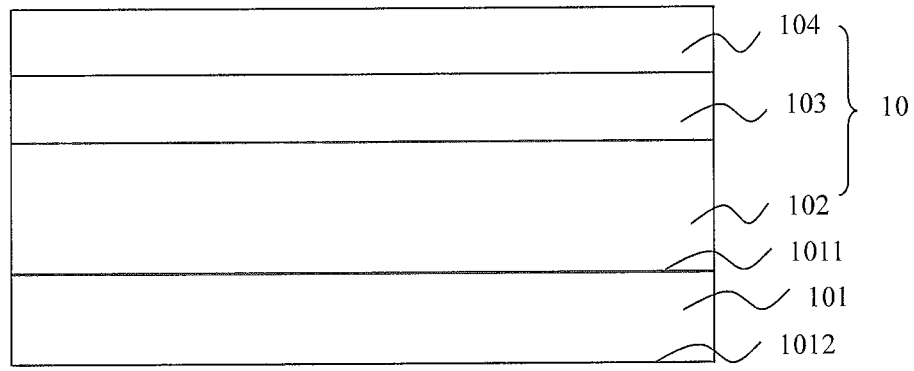
FIGS. 4A to 4F illustrate a process flow of another method of fabricating a light emitting device of the fourth embodiment in the present disclosure.

FIGS. 4A to 4F illustrate a fourth embodiment of the present disclosure. In this embodiment, the process can be performed in the wafer level. FIG. 4A shows a substrate 101 having a first major surface 1011 and a second major surface 1012 opposite to the first major surface 1011. Following, forming an epitaxial stack 10 including the first conductivity semiconductor layer 102, the active layer 103 and the second conductivity semiconductor layer 104 subsequently on the first major surface 1011 of the substrate 101.

Figure 4B:
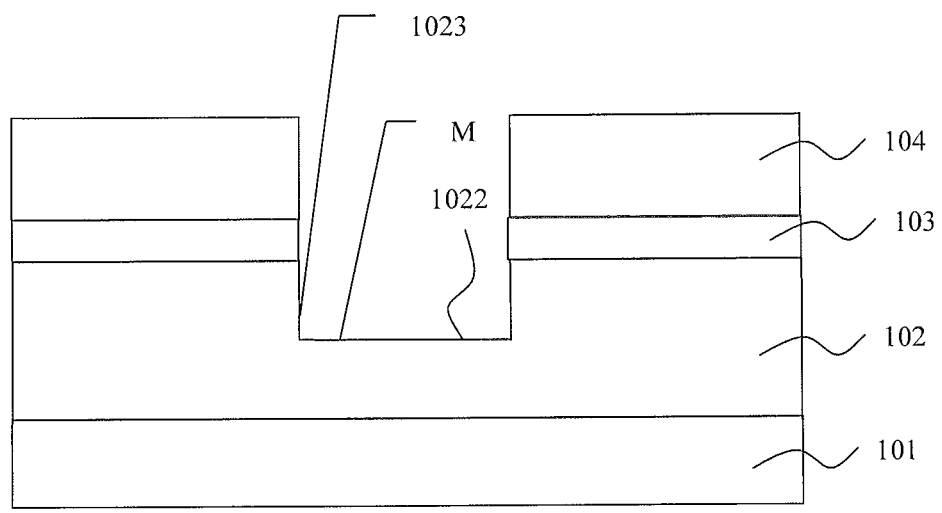

FIG. 4B shows a mesa M formed on the epitaxial stack 10 to expose the sidewall of the second conductivity semiconductor layer 104, the sidewall of the active layer 103 and the second surface 1022 and the third surface 1023 of the first conductivity semiconductor layer 102.

Figure 4C:
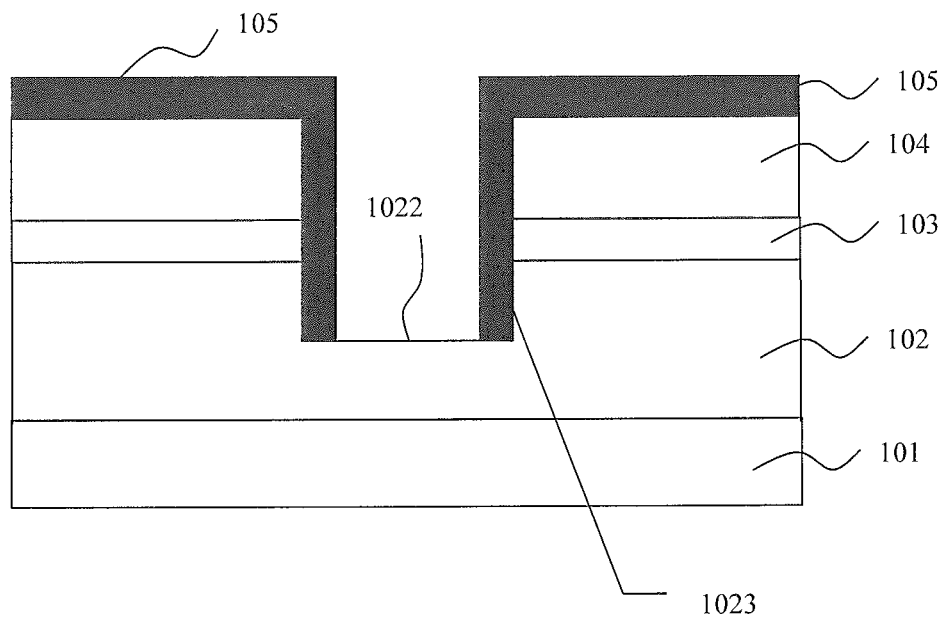

FIG. 4C shows an etching protection layer 105 formed on the top of the second conductivity semiconductor layer 104, the exposed sidewall of the second conductivity semiconductor layer 104, the exposed sidewall of the active layer 103 and the third surface 1023 of the first conductivity semiconductor layer 102. The material of the etching protection layer 105 can be $SiO_2$ or $SiN_x$.

Figure 4D:
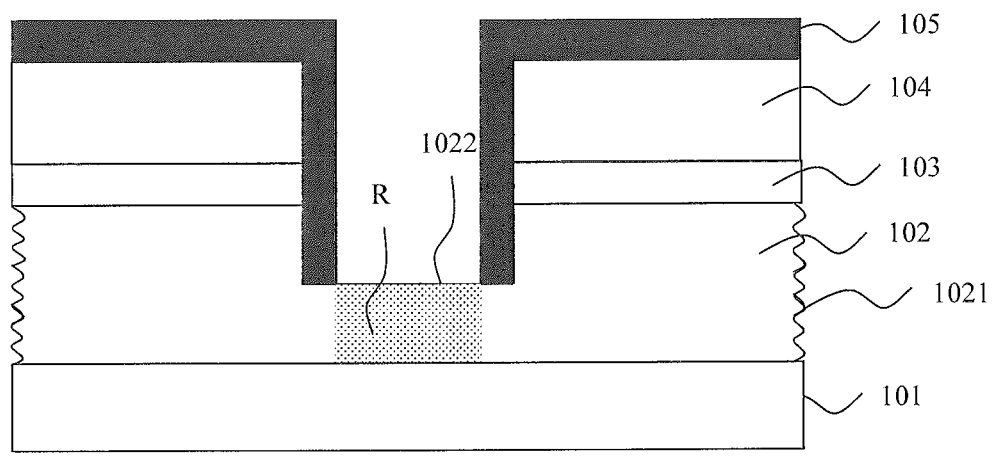

As shown in FIG. 4D, after forming the etching protection layer 105, an etching process is performed to form at least one rough structure R on the first surface 1021 and the second surface 1022 of the first conductivity semiconductor layer 102. The first surface 1021 and the second surface 1022 of the first conductivity semiconductor layer 102 can be etched by the following method to form a least one rough structure such as pore, void, bore, pinhole, cavity or porous structure.

The methods include: 1) Wet etching with an aqueous solution of a least one of $H_2SO_4$, $H_3PO_4$, $H_2C_2O_4$, HCl, KOH, and NaOH, ethylene glycol solution or their mixture;

2) Electrochemical etching with an aqueous solution of a least one of $H_2SO_4$, $H_3PO_4$, $H_2C_2O_4$, HCl, KOH, and NaOH, an ethylene glycol solution or their mixture; or 3) Dry etching such as inductive coupling plasma (ICP), reactive ion etch (RIE) by a gas containing at least one of HCl, $Cl_2$, $SF_6$, $BCl_3$ and $CH_4$.

In one embodiment, by adjustable with the conditions for formation, the rough structures R on the first surface 1021 can be extending from the surface into the first conductivity semiconductor layer 102 and forming rough structures inside the first conductivity semiconductor layer 102.

Figure 4E:
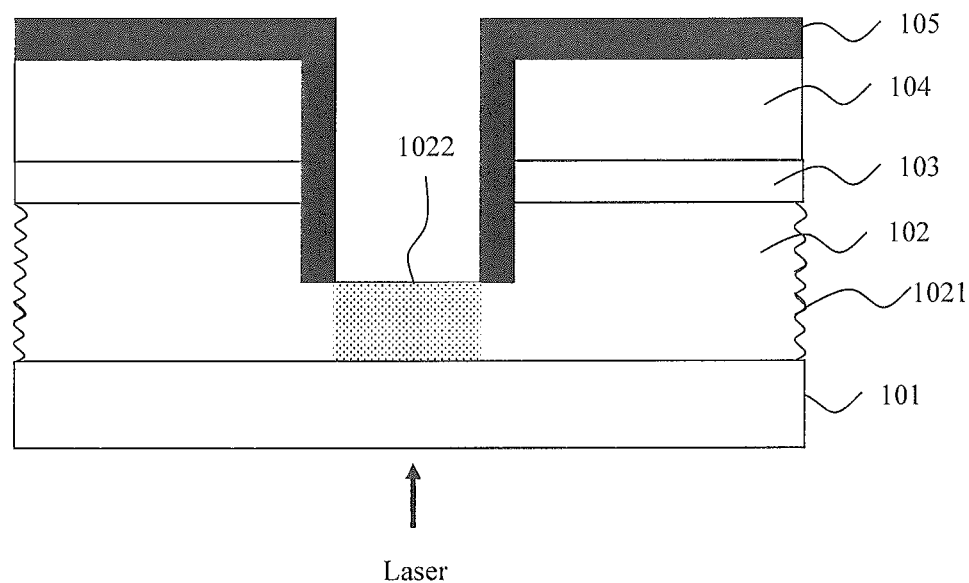

As shown in FIG. 4E, a laser is introduced in the second major surface 1012 of the substrate to dice the wafer into separated light emitting device.

Figure 4F:
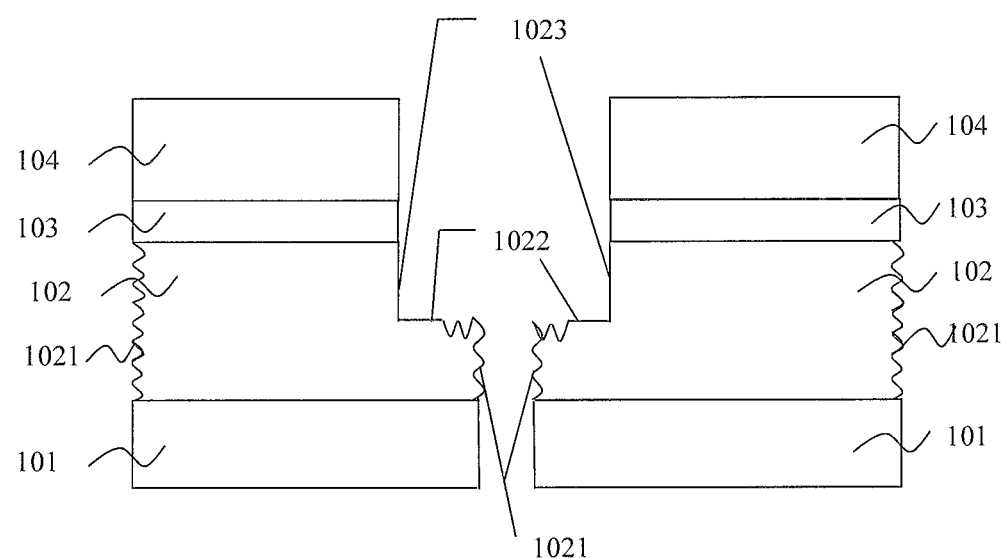

As shown in FIG. 4F, the rough structure can be formed on the first surface 1021 and the second surface 1022 of the first conductivity semiconductor layer 102 by any of these methods mentioned above. However, the shape, density, distance and/or depth thereof is adjustable with the conditions for formation.

The shape of the rough structures is adjustable by the etching conditions, and can form various types such as circle, hexagon, dodecagon, conical, or pyramidal shapes.

The depth of the rough structure can be 10 nm-5000 nm, 500 nm-5000 nm, 1000 nm-5000 nm, 2000 nm-5000 nm, 3000 nm-5000 nm, or 4000 nm-5000 nm. The distance between each rough structure can be 10 nm-10000 nm, 100 nm-10000 nm, 500 nm-10000 nm, 1000 nm-10000 nm, 2000 nm-10000 nm, 4000 nm-10000 nm, 6000 nm-10000 nm, or 8000 nm-10000 nm. The percentage of the area occupied by the rough structures on the surface of the first conductivity semiconductor layer 102 is 5%-90%, 10%-90%, 20%-90%, 30%-90%, 40%-90%, 50%-90%, 60%-90%, 70%-90%, or 80%-90%

In one embodiment of this disclosure, the first surface 1021 and the second surface 1022 of the first conductivity semiconductor layer 102 is etched by electrochemical etching with the voltage of 5V-10V, 5V-20V, 5-30V or 5V-40V. The etch time is 1 min-10 min, 1 min-20 min, 1 min-30 min, 1 min-40 min, 1 min-50 min or 1 min-1 hr. In one embodiment, the electrochemical etching is performed in an aqueous solution of $H_2C_2O_4$.

In one embodiment of this disclosure, the etching process can be performed twice with any of these methods on the first surface 1021 and the second surface 1022 of the first conductivity semiconductor layer 102. In one embodiment, the dry etching can be performed first, and the electrochemical etching is performed next on a least one of the first surface 1021 and the second surface 1022 of the first conductivity semiconductor layer 102.

Figure 5A:
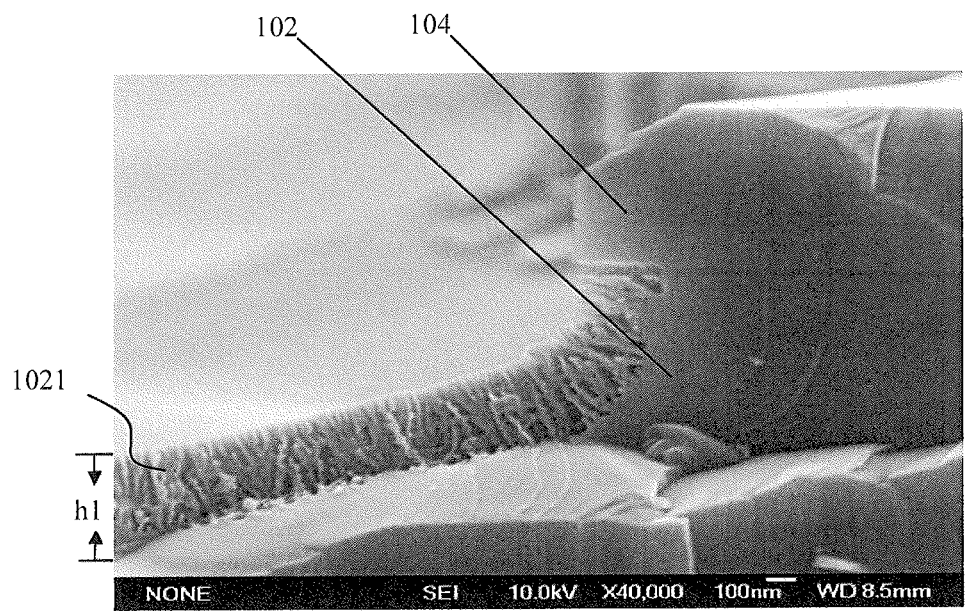
FIGS. 5A to 5C illustrate scanning electron microscope (SEM) pictures of the first embodiment in the present disclosure.

FIG. 5A illustrates a cross-sectional Scanning Electron Microscope (SEM) picture of the first embodiment in the present disclosure. As the picture shows, the surface 1021 of the first conductivity semiconductor layer 102 is a substantially textured surface having rough structures with the etched depth h1 and the surface of the second conductivity semiconductor layer is a substantially smooth surface.

Figure 5B:
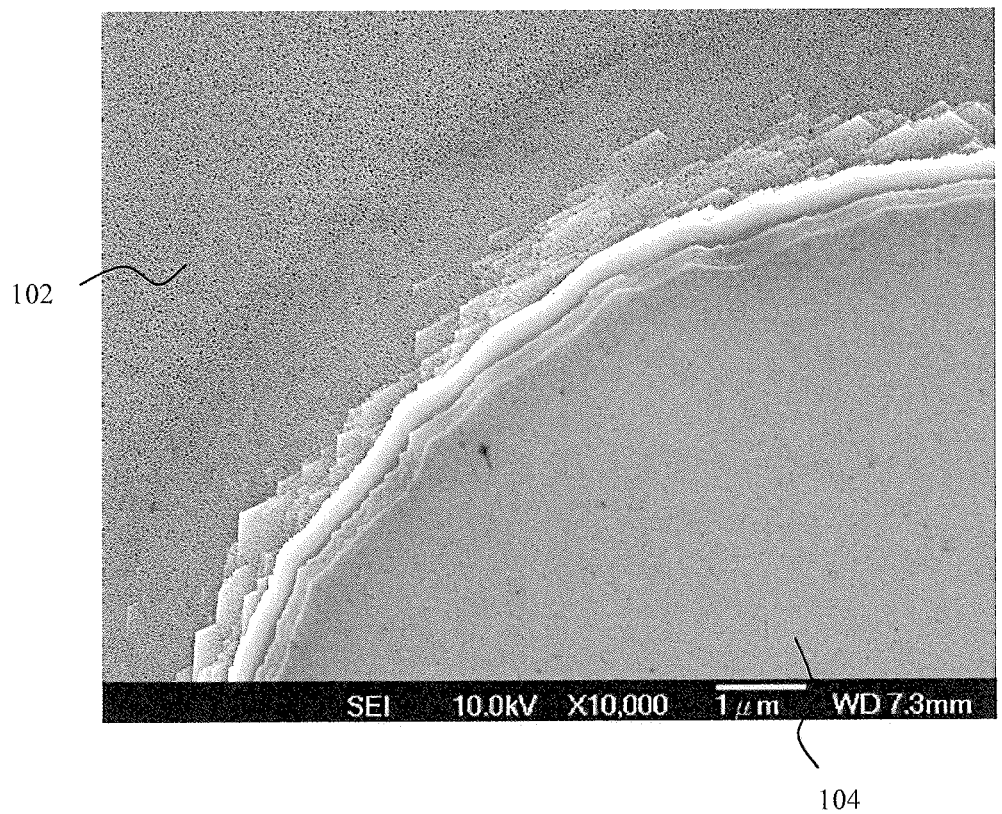

FIG. 5B illustrates a top-view Scanning Electron Microscope (SEM) picture of the first embodiment in the present disclosure. As the picture shows, the first conductivity semiconductor layer 102 has a substantially textured surface and the second conductivity semiconductor layer has a substantially smooth surface.

Figure 5C:
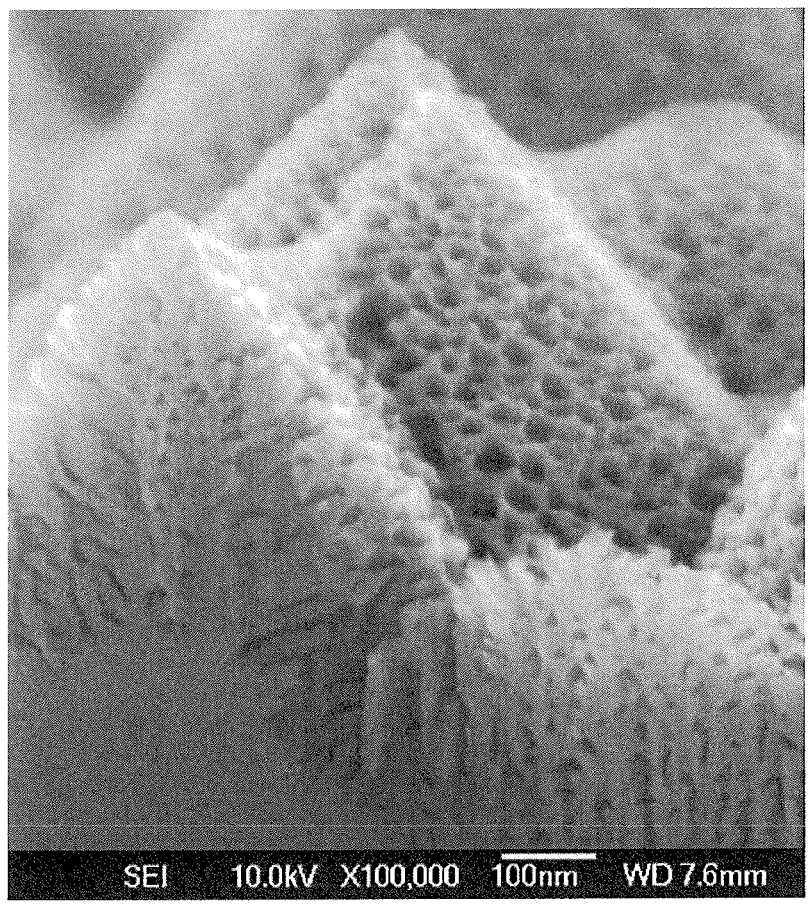

FIG. 5C illustrates a cross-sectional Scanning Electron Microscope (SEM) picture of the first embodiment in the present disclosure. As the picture shows, the surface 1021 of the first conductivity semiconductor layer 102 is a double rough structure.

In this disclosure, the epitaxial stack 10 can be selectively etched in only the surface of the first conductivity semiconductor layer 102 but not the active layer 103 and the second conductivity semiconductor layer 104. It can improve the confinement of the light beam pattern, the reliability of the device and increasing vertical light extraction efficiency.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A light-emitting device comprising:
   a substrate;
   a first semiconductor layer disposed on the substrate and having a first surface;

a rough structure formed in the first semiconductor layer, the rough structure comprising porous structures formed therein and a portion of the porous structures having openings exposed on the first surface of the first semiconductor layer; and an active layer formed on the first semiconductor layer.

2. The lighting-emitting device of claim 1, wherein the porous structures have a portion not covered by the active layer.

3. The lighting-emitting device of claim 1, wherein the rough structure further comprises a pore, a void, a bore, a pinhole, or a cavity.

4. The lighting-emitting device of claim 1, wherein the first semiconductor layer has a second surface, wherein the second surface is parallel to a surface of the substrate and connects the first surface, and a portion of the porous structures has openings formed and exposed on the second surface.

5. The lighting-emitting device of claim 4, further comprising a second electrode formed on the second surface of the first semiconductor layer.

6. The lighting-emitting device of claim 4, wherein an average width of the openings exposed on the first surface is different from an average width of the openings exposed on the second surface.

7. The lighting-emitting device of claim 4, wherein a portion of the openings exposed on the second surface has a depth h1, another portion of the openings exposed on the second surface has a depth h2, and h1 is smaller than h2.

8. The lighting-emitting device of claim 1, further comprising a mesa exposing the active layer and the first semiconductor layer.

9. The lighting-emitting device of claim 1, further comprising:

a second semiconductor layer; and a first electrode formed on the second semiconductor layer.

10. The lighting-emitting device of claim 9, further comprising a transparent conductive oxide layer formed between the first electrode and the second semiconductor layer.

11. The lighting-emitting device of claim 1, wherein the active layer is narrower than the first semiconductor layer.

12. The lighting-emitting device of claim 1, wherein the first surface comprises a textured surface, the first openings are exposed on the textured surface.

* * * * *